(12) United States Patent
Yamauchi

(10) Patent No.: US 8,238,177 B2
(45) Date of Patent: Aug. 7, 2012

(54) INTEGRATED CIRCUIT

(75) Inventor: Hisashi Yamauchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 309 days.

(21) Appl. No.: 12/662,040

(22) Filed: Mar. 29, 2010

(65) Prior Publication Data
US 2010/0254205 A1 Oct. 7, 2010

(30) Foreign Application Priority Data

Apr. 2, 2009 (JP) .................................. 2009-089878

(51) Int. Cl.
*G11C 7/00* (2006.01)
(52) U.S. Cl. ...................... 365/200; 365/201; 365/225.7
(58) Field of Classification Search .................. 365/200, 365/201, 225.7, 230.06
See application file for complete search history.

(56) References Cited

U.S. PATENT DOCUMENTS

| | | | | |
|---|---|---|---|---|
| 5,657,281 A | * | 8/1997 | Rao ............................... | 365/200 |
| 5,689,465 A | * | 11/1997 | Sukegawa et al. ............ | 365/200 |
| 6,388,929 B1 | * | 5/2002 | Shimano et al. .............. | 365/201 |
| 6,728,149 B2 | * | 4/2004 | Akamatsu ...................... | 365/200 |
| 6,850,454 B2 | * | 2/2005 | Kuge et al. .................... | 365/227 |
| 7,539,071 B2 | | 5/2009 | Kurozumi et al. | |

FOREIGN PATENT DOCUMENTS

JP 2007-323726 12/2007

* cited by examiner

*Primary Examiner* — Gene Auduong
(74) *Attorney, Agent, or Firm* — McGinn IP Law Group, PLLC

(57) ABSTRACT

Provided is an integrated circuit including: multiple memory cells; a redundant memory having a function of repairing a defective cell included in the multiple memory cells by placing a corresponding fuse among multiple fuses into a first state; a fuse data conversion circuit that generates first information of a first defective cell based on position information of the fuse placed into the first state corresponding to the first defective cell having been repaired; a repair data generation circuit that generates, upon detection of a second defective cell as a result of a test for the multiple memory cells, repair information for repairing the second defective cell according to the first information and second information of the second defective cell; and a fuse state change circuit that places a predetermined fuse among the multiple fuses into the first state according to the repair information generated by the repair data generation circuit.

7 Claims, 6 Drawing Sheets

INTEGRATED CIRCUIT

INCORPORATION BY REFERENCE

This application is based upon and claims the benefit of priority from Japanese patent application No. 2009-089878, filed on Apr. 2, 2009, the disclosure of which is incorporated herein in its entirety by reference.

BACKGROUND

1. Field of the Invention

The present invention relates to an integrated circuit, and more particularly, to an integrated circuit having a redundancy repair function.

2. Description of Related Art

When a defective memory cell exists in a semiconductor integrated circuit having a built-in RAM or the like, the defective memory cell is replaced with a spare memory cell so that the defective memory cell is equivalently repaired, thereby improving the production yield. In this manner, current semiconductor integrated circuits adopt redundancy (redundant configuration) in which a redundant or spare memory cell is provided so that a defective memory cell is repaired by being replaced with the spare memory cell.

In recent years, the capacity of memory circuits, such as a built-in RAM, has been increasing. Thus, if such redundancy is not utilized in memory circuits, the production yield may deteriorate. Moreover, the location of a defect failure varies depending on ambient conditions. Specifically, a defect may occur at a certain address under the condition of high temperature and high voltage, while a defect may occur at another address under the condition of low temperature and low voltage. Therefore, there is a demand for a method and circuit capable of performing redundancy repair on the defects, which occur under various conditions as described above, at low cost.

As a related art, Japanese Unexamined Patent Application Publication No. 2007-323726 discloses a method for shortening the time required to transfer repair information for repairing a defect in a redundant memory and the time required to cut a fuse.

SUMMARY

The conventional defect repair method for a memory circuit having redundancy as disclosed in Japanese Unexamined Patent Application Publication No. 2007-323726, for example, requires redundancy repair information in an integrated circuit based on defect information (e.g., information such as a defective address or a defective bit) obtained when a defect is detected during a test made under a single condition. Then, a fuse corresponding to the redundancy repair information is cut (fused) to thereby perform redundancy repair. In this method, however, the location of a defective portion may vary if the ambient conditions such as temperature are changed as described above. Therefore, it is necessary to store in some way the defect information obtained under both conditions.

In many cases, it takes a long time to change the ambient conditions. For example, when tests are run at multiple temperatures, it takes a long time to change and stabilize the ambient temperature of an integrated circuit. This causes a problem in that the time for which one chip occupies a tester becomes longer, resulting in an increase in test cost. Furthermore, when repair processing is carried out by BIST (Built-In-Self-Test) or the like in an integrated circuit, it is necessary to hold data in a register or latch, which is provided in the integrated circuit, for a period of time during which the conditions are changed. This causes another problem in that it is necessary to wait while continuously supplying a power supply voltage to the integrated circuit so as not to lose the defect information obtained as a result of the test previously performed, resulting in an increase in power consumption.

Moreover, when the defect information indicating the test result is not held in the integrated circuit but is temporarily read out, the defect information indicating the test result is read out to an external device such as a tester. After the test conditions are changed, it is necessary to resume the test by reading out the corresponding defect information again so that the information corresponds to identification information such as a chip ID of the integrated circuit. For this reason, the correspondence between information for identifying an integrated circuit and corresponding defect information needs to be stored and managed appropriately.

A first exemplary aspect of the present invention is an integrated circuit including: a plurality of memory cells; a plurality of fuses; a redundant memory having a function of repairing a defective cell included in the plurality of memory cells by placing a corresponding fuse among the plurality of fuses into a first state; a fuse data conversion circuit that generates first information of a first defective cell based on position information of the fuse placed into the first state, the fuse corresponding to the first defective cell having been repaired; a repair data generation circuit that generates, upon detection of a second defective cell as a result of a test for the plurality of memory cells, repair information for repairing the second defective cell according to the first information of the first defective cell and second information of the second defective cell detected; and a fuse state change circuit that places a predetermined fuse among the plurality of fuses into the first state according to the repair information generated by the repair data generation circuit.

The integrated circuit according to the first exemplary aspect of the present invention is capable of storing, as position information, repair information of a defective cell detected in the previous test, and generating information of the defective cell based on the position information. Thus, it is possible to compare information of a defective cell detected in a newly performed test with the information of the defective cell detected in the previous test. This eliminates the need for storing and managing the defect information in an external device and for occupying a tester until the test conditions are changed.

The integrated circuit according to the present invention can improve the test efficiency.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
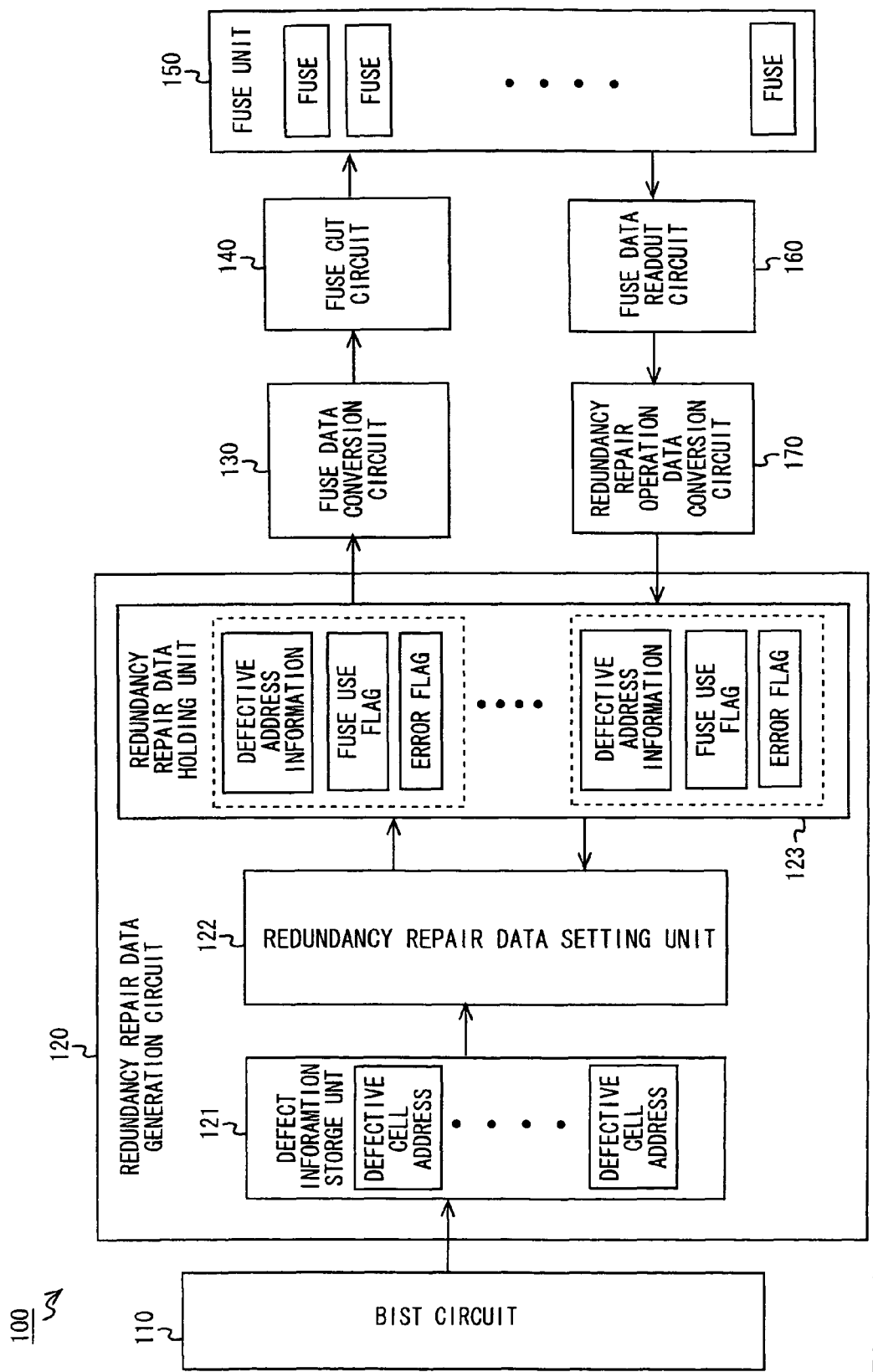
FIG. 1 is a block diagram showing a redundancy control circuit according to a first exemplary embodiment of the present invention.

A first exemplary embodiment of the present invention will be described in detail below with reference to the drawings. FIG. 1 shows the configuration of a redundancy control circuit 100 of an integrated circuit according to this exemplary embodiment. It is assumed that the redundancy control circuit 100 controls the redundancy of a memory circuit included in the semiconductor integrated circuit incorporating the redundancy control circuit 100.

Referring to FIG. 1, the redundancy control circuit 100 includes a BIST (Built-In-Self-Test) circuit 110, a redundancy repair data generation circuit 120, a fuse data conversion circuit 130, a fuse cut circuit 140, a fuse unit 150, a fuse data readout circuit 160, and a redundancy repair operation data conversion circuit 170.

The BIST circuit 110 performs a test on the memory circuit, which is included in the integrated circuit incorporating the redundancy control circuit 100, under a predetermined condition. Further, the BIST circuit 100 sends defect information indicating the test result to the redundancy repair data generation circuit 120.

The fuse data conversion circuit 130 converts redundancy repair data generated by the redundancy repair data generation circuit 120 into information indicating a bit position of a fuse for use in repairing a defect and the value of the bit position, and outputs the information. The fuse cut circuit 140 cuts a fuse of the fuse unit 150 (placed into a first state) according to the information received from the fuse data conversion circuit 130. Note that the fuse data conversion circuit 130 and the fuse cut circuit 140 constitute a fuse state change circuit.

The fuse unit 150 includes a number of fuses for use in redundancy repair. When the repair is performed by replacing a defective row with a redundant row, a fuse corresponding to the redundant row is cut. Each fuse of the fuse unit 150 has bit position information. Accordingly, the value of the bit position information can specify which fuse is to be cut or which fuse has been cut.

The fuse data readout circuit 160 reads out information about the bit position of the fuse cut by the fuse cut circuit 140 and the value of the bit position. The redundancy repair operation data conversion circuit 170 converts the information about the bit position of the fuse and the value of the bit position read out by the fuse data readout circuit 160 into redundancy repair data on the redundancy repair previously performed, and sends the redundancy repair data to the redundancy repair data generation circuit 120. For example, the address of the defective row can be specified by the position information of the fuse which has been cut so as to perform the redundancy repair by replacing the defective row with the redundant row. For this reason, the redundancy repair operation data conversion circuit 170 sends the redundancy repair data including the address of the defective row to the redundancy repair data generation circuit 120. Note that the fuse data readout circuit 160 and the redundancy repair operation data conversion circuit 170 constitute a fuse data conversion circuit.

The redundancy repair data generation circuit 120 includes a defect information storage unit 121, a redundancy repair data setting unit 122, and a redundancy repair data holding unit 123. The redundancy repair data generation circuit 120 generates defect information indicating the test result sent from the BIST circuit 100, and redundancy repair data on a defective cell to be subjected to redundancy repair by the test according to the defect information sent from the redundancy repair operation data conversion circuit 170. Defect information (e.g., address information of a defective cell) for use in the redundancy repair according to the test result is set as the generated redundancy repair data.

The defect information storage unit 121 stores the defect information received from the BIST circuit 110. The defect information storage unit 121 stores, for example, defective address information of a memory cell array which has been tested by the BIST circuit.

The redundancy repair data setting unit 122 sets the redundancy repair data according to the defect information stored in the defect information storage unit 121 and according to the redundancy repair data held in the redundancy repair data holding unit 123. Based on the setting, the redundancy repair data setting unit 122 determines how to repair a number of defects detected by the BIST circuit 110. As a specific example of the determination method, the redundancy repair as described below may be employed.

For example, a description is given of the case where, when a number of defective portions occur at the same row address, the redundancy repair for the defective portions is performed by replacing all the defects with one redundant row. In the case of repair as mentioned above, a fuse for repairing each defect is to be cut by the fuse cut circuit 140. In other words, a defective row address corresponding to the fuse can be specified by specifying the bit position of the cut fuse.

The redundancy repair data holding unit 123 stores the redundancy repair data set by the redundancy repair data setting unit 122 and the redundancy repair data sent from the redundancy repair operation data conversion circuit 170. The redundancy repair data includes information such as defective address information, a fuse use flag, and an error flag.

The operation of the redundancy control circuit 100 as described above will be described. In this exemplary embodiment, it is assumed that a number of defects occur. It is also assumed that a number of redundant rows (a first redundant row, a second redundant row, . . . ), which can be used for the redundancy repair, are prepared in the memory circuit (not shown) of the semiconductor integrated circuit incorporating the redundancy control circuit 100. In the following description, "RQ1" denotes a storage location for redundancy repair data required for the use of the first redundant row; "RQ2" denotes a storage location for redundancy repair data required for the use of the second redundant row, and "RQ3" denotes a storage location for redundancy repair data required for the use of the third redundant row. The term "storage location" herein described refers to a register group. The redundancy repair data holding unit 123 includes the register groups.

Further, "RQ1a" and "RQ1b" each denote data stored in the redundancy repair data storage location RQ1. "RQ2a" and "RQ2b" each denote data stored in the redundancy repair data storage location RQ2. "RQ3a" and "RQ3b" each denote data stored in the redundancy repair data storage location RQ3. Herein, "RQ1a", "RQ2a", and "RQ3a" each represent data directly generated by the redundancy repair data setting unit 122, and "RQ1b", "RQ2b", and "RQ3b" each represent data obtained by converting data read out from a fuse into redundancy repair data.

Under a first condition, a test and redundancy repair for the memory circuit are carried out. First, the test for the memory circuit is performed by the BIST circuit 110. The defect information indicating the test result is sent to the redundancy repair data generation circuit 120. The defect information storage unit 121 stores the defect information. The redundancy repair data setting unit 122 sets the redundancy repair data RQ1a according to the defect information stored in the defect information storage unit 121. In this exemplary embodiment, a defective row address ROW1 at which the defects occur, a fuse use flag indicating the value "0", and a error flag indicating the value "0" are set as the redundancy repair data RQ1a. Then, the redundancy repair data RQ1a is stored in the redundancy repair data holding unit 123.

The fuse data conversion circuit 130 converts the defective row address ROW1 of the redundancy repair data RQ1a, which is held in the redundancy repair data holding unit 123, into the bit position of a fuse to be cut for defect repair, and the value of the bit position. The fuse cut circuit 140 cuts a fuse located at a position corresponding to the value obtained through the conversion by the fuse data conversion circuit 130. This permits the use of the first redundant row, and the redundancy repair to be carried out under the first condition. Fuse cutting is carried out in this manner, so that the defect repair information obtained under the first condition is stored in the fuse unit 150.

Then, under a second condition, a test and redundancy repair for the redundancy control circuit 100 are carried out. First, the fuse data readout circuit 160 reads out the bit position information of the fuse which has been cut for the redundancy repair carried out under the first condition. The redundancy repair operation data conversion circuit 170 converts the information about the value of the fuse bit position read out by the fuse data readout circuit 160 into the redundancy repair data RQ1b, and sends the redundancy repair data RQ1b to the redundancy repair data generation circuit 120. Then, the redundancy repair data RQ1b is held in the redundancy repair data holding unit 123.

The defect row address ROW1 detected under the first condition, the fuse use flag indicating the value "1", and the error flag indicating the value "0" are set as the redundancy repair data RQ1b. Note that the value "1" of the fuse use flag indicates that the redundancy repair is performed under the first condition and the fuse corresponding to the first redundant row is cut.

Further, a test for the memory circuit is performed by the BIST circuit 110 under the second condition. The defect information indicating the test result is sent to the redundancy repair data generation circuit 120. The defect information storage unit 121 stores the defect information. The redundancy repair data setting unit 122 determines that the redundancy repair is not newly performed when the defect information stored in the defect information storage unit 121 indicates that all the defects occur at the same row address and that the defective row address matches the defective row address of the redundancy repair data RQ1b. Thus, fuse cutting is not newly performed thereafter.

In this case, as a result of the test, a defect may be detected in a redundant area, i.e., a first redundant row portion. When a defect is detected as a result of the test for the redundant area, i.e., the first redundant row portion, the redundancy repair data setting unit 122 sets the value of the error flag of the redundancy repair data storage location RQ1 to "1". When the error flag of the redundancy repair data storage location RQ1 indicates "1", the redundancy repair data setting unit 122 sets the defective row address to the redundancy repair data storage location RQ2 of the second redundant row, instead of setting the redundancy repair data to the first redundant row. After that, as is the case under the first condition, the fuse data conversion circuit 130 and the fuse cut circuit 140 operate to cancel the use of the first redundant row, thereby permitting the use of the second redundant row. In this case, however, it is prerequisite that the memory circuit has a circuit configuration capable of cancelling the first redundant row.

Further, a description is given of the case where, as a result of the test for the memory circuit performed by the BIST circuit 110 under the second condition, all the defects occur at two row addresses, and a first defective row is a redundancy repair target in the test conducted under the first condition and is registered as the redundancy repair data RQ1b. It is assumed herein that no defect exists in the redundant row portion. In this case, the first defective row is replaced with the first redundant row. Accordingly, redundancy repair data corresponding to a second defective row address ROW2 is set as "RQ2". In this exemplary embodiment, the second defective row address ROW2 at which a number of defects occur, the use flag indicating the value "0", and the error flag indicating the value "0" are set as the redundancy repair data RQ2a. Then, the redundancy repair data RQ2a is held in the redundancy repair data holding unit 123.

After that, as is the case under the first condition, the fuse data conversion circuit 130 converts the defective row address ROW2 of the redundancy repair data RQ2a, which is held in the redundancy repair data holding unit 123, into the bit position of a fuse to be cut for defect repair, and the value of the bit position. The fuse cut circuit 140 cuts a fuse located at a position corresponding to the value obtained through the conversion by the fuse data conversion circuit 130. This permits the use of the second redundant row, and the redundancy repair to be carried out under the second condition. The fuse cutting is carried out in this manner, so that the defect repair information obtained under the second condition is stored in the fuse unit 150.

Moreover, under a third condition, a test and redundancy repair for the memory circuit may be carried out, and processing similar to that described above may be repeated. In this manner, the redundancy repair for repairing occurring defects is carried out under multiple conditions.

Figure 2:
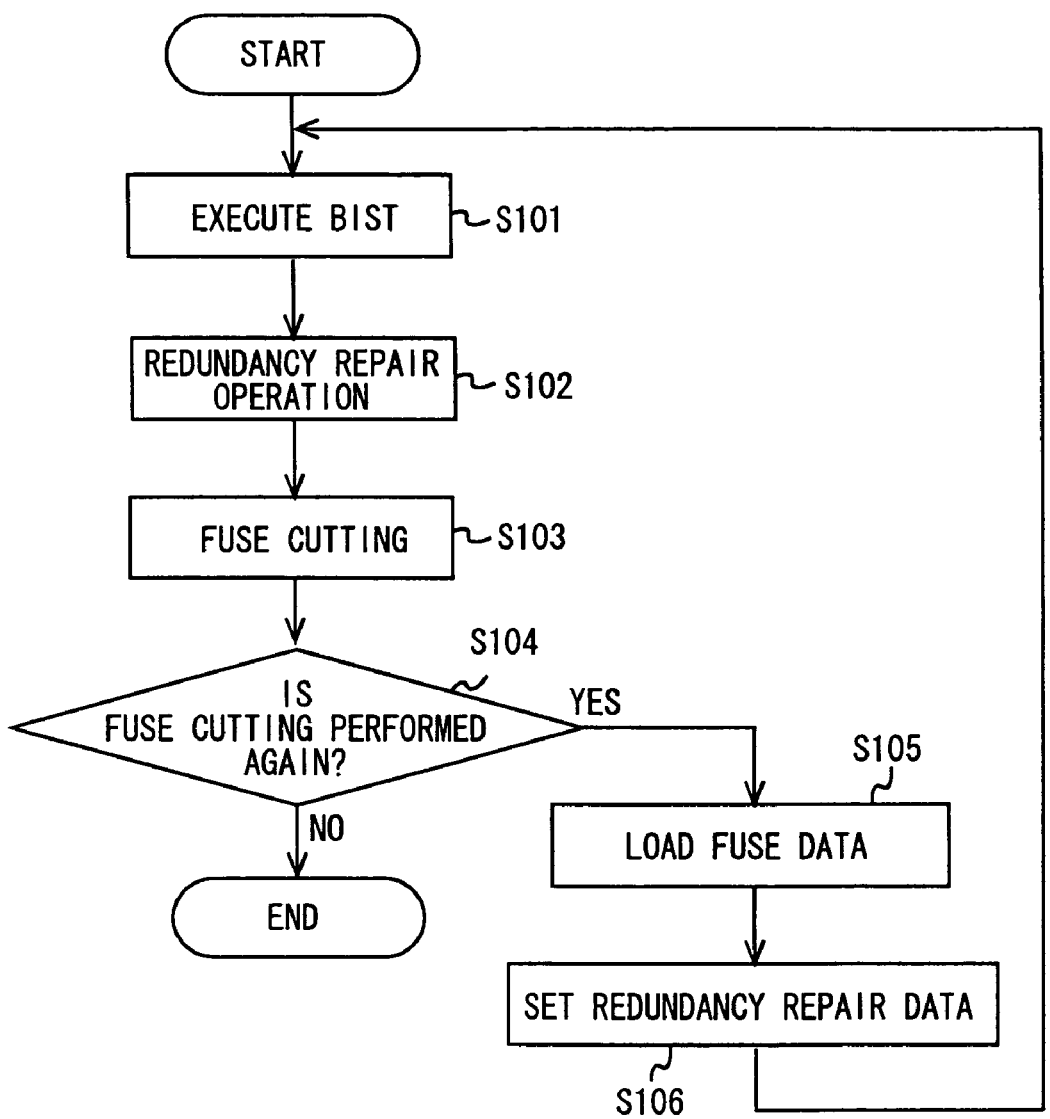
FIG. 2 is a flowchart showing operation of the redundancy control circuit according to the first exemplary embodiment.
Figure 3:
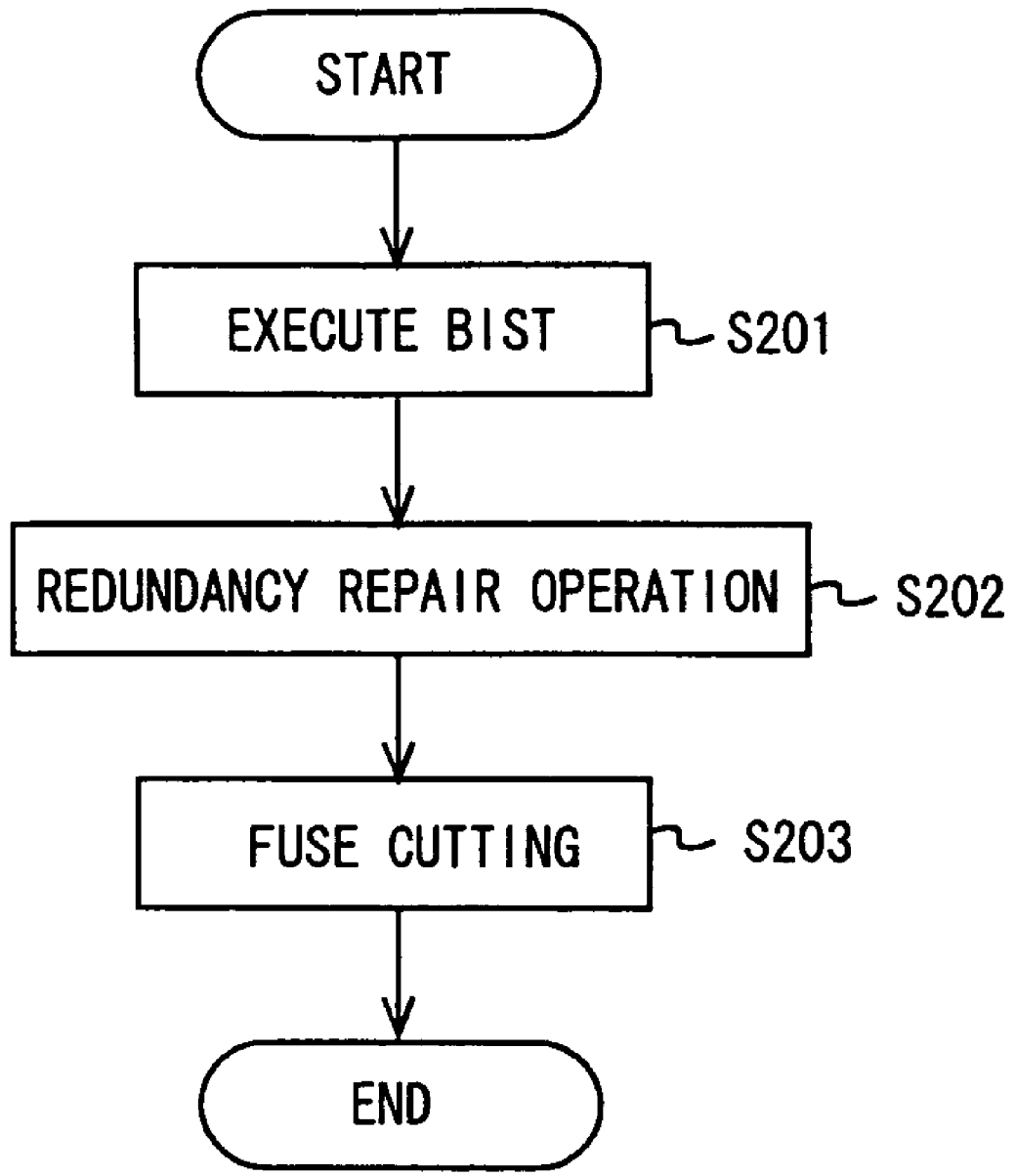
FIG. 3 is a flowchart showing operation of a redundancy control circuit of a related art.

FIG. 2 shows a flowchart showing the operation of the redundancy control circuit 100 according to the first exemplary embodiment. For comparison, FIG. 3 shows a flowchart of an exemplary operation of an integrated circuit having a redundancy repair function in a related art disclosed in, for example, Japanese Unexamined Patent Application Publication No. 2007-323726. First, in the integrated circuit of the related art shown in FIG. 3, BIST is executed (S201). A redundancy repair operation is performed based on the result of BIST (S202). Based on the operation result, fuse cutting is carried out (S203). Thus, in the related art, the redundancy repair is completed by performing fuse cutting once.

Meanwhile, in the redundancy control circuit 100 shown in FIG. 2, BIST is executed (S101). A redundancy repair operation is performed based on the result of BIST (S102). Based on the operation result, fuse cutting is carried out (S103). In this case, when fuse cutting is performed again (YES in S104), the data on the fuse, which has previously been cut, is loaded (S105). Based on the previous fuse data, the redundancy repair data is set (S106). After that, based on the redundancy repair data set in S106, BIST is executed again (S101).

After that, the processings of S102 and S103 are carried out and repeated until there is no need to perform fuse cutting again (NO in S104). Thus, the redundancy control circuit 100 uses the data on the fuse, which has been previously cut, to perform redundancy repair processing.

The conventional defect repair method for a memory circuit having redundancy requires redundancy repair information in an integrated circuit based on defect information obtained when a defect is detected during a test made under a single condition. Further, a fuse corresponding to the redundancy repair information is cut to thereby perform redundancy repair. In this method, if the location of a defective portion varies under multiple test conditions, the defect information obtained under each condition needs to be stored outside the integrated circuit.

Meanwhile, in the integrated circuit incorporating the redundancy control circuit 100 of the first exemplary embodiment, repair information of a defect portion detected as a result of a test made under a single condition is stored as bit position information of a cut fuse. Then, during a test made under another condition, the fuse data readout circuit 160 reads out the repair information of the previous defect portion from the information of the cut fuse. Further, the redundancy repair operation data conversion circuit 170 converts the read data into redundancy repair data. A redundancy repair operation is carried out based on the previous redundancy repair data obtained after conversion and the result of the test currently conducted. Based on the operation result, the defect repair is carried out under multiple conditions. Thus, the integrated circuit incorporating the redundancy control circuit 100 stores the repair information of the defect portion, which is obtained as a result of the test conducted under a single condition, as the bit position information of the cut use. As a result, even when the power of the integrated circuit is turned off, the repair information of the defective portion is held in the integrated circuit. Accordingly, the redundancy repair processing can be carried out in the integrated circuit based on the results of the tests conducted under multiple conditions. This results in the elimination of the need to store the redundancy repair data obtained under each condition, outside the integrated circuit, and to manage the stored data. This allows a reduction in test facilities and an improvement in test efficiency.

Second Exemplary Embodiment

Figure 4:
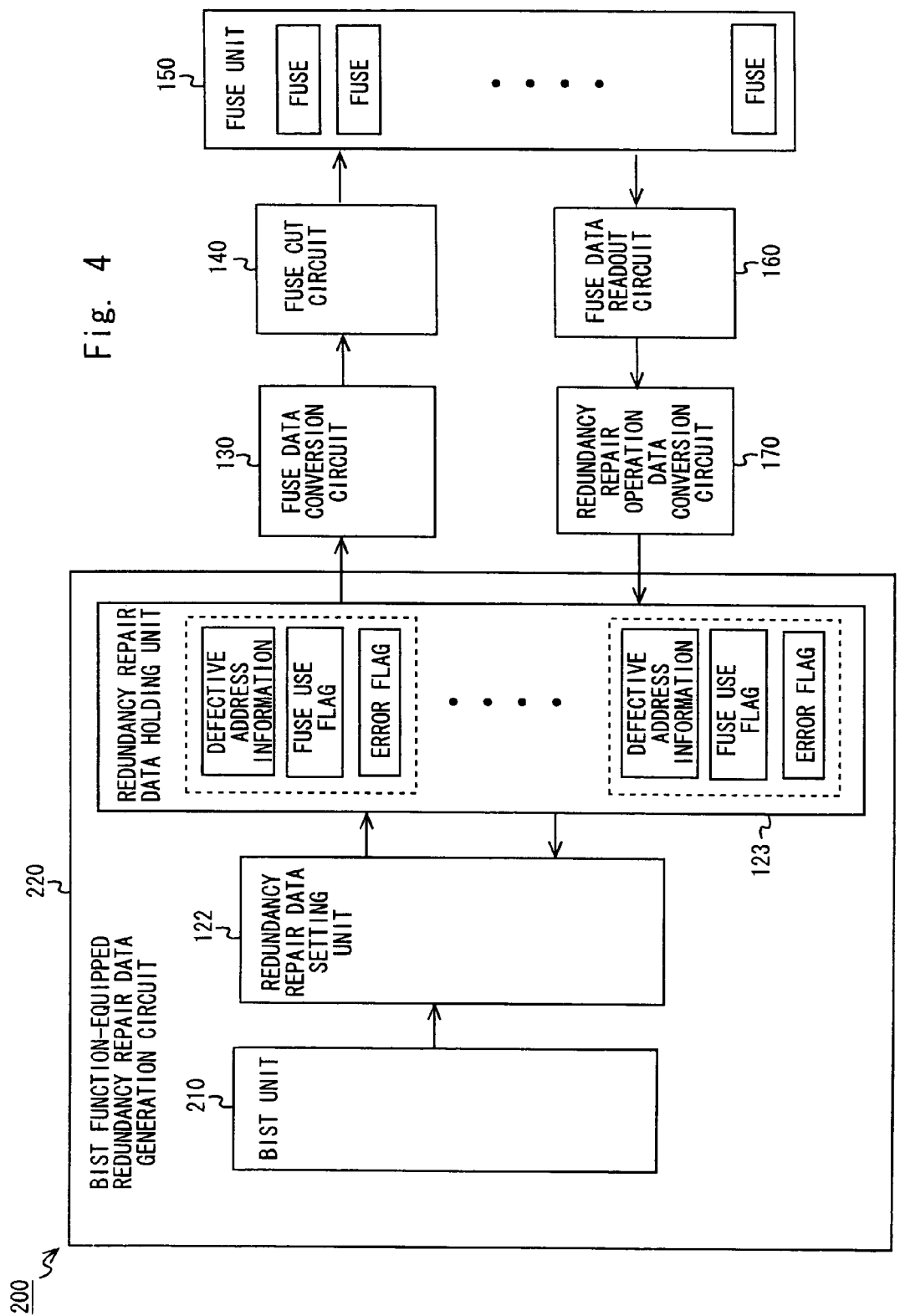
FIG. 4 is a block diagram showing a redundancy control circuit according to a second exemplary embodiment of the present invention.

A second exemplary embodiment of the present invention will be described in detail below with reference to the drawings. It is assumed that a redundancy control circuit 200 described in the second exemplary embodiment controls the redundancy of a memory circuit included in a semiconductor integrated circuit incorporating the redundancy control circuit 200, as with the first exemplary embodiment. FIG. 4 shows the redundancy control circuit 200 according to the second exemplary embodiment.

Referring to FIG. 4, the redundancy control circuit 200 includes a BIST function-equipped redundancy repair data generation circuit 220, the fuse data conversion circuit 130, the fuse cut circuit 140, the fuse unit 150, the fuse data readout circuit 160, and the redundancy repair operation data conversion circuit 170. The components of FIG. 4 denoted by reference numerals identical to those of FIG. 1 have configurations identical or similar to those of FIG. 1. In the second exemplary embodiment, the differences from the first exemplary embodiment are mainly explained, and description of the other configurations is omitted.

Unlike the first exemplary embodiment, the redundancy control circuit 200 of the second exemplary embodiment includes the BIST function-equipped redundancy repair data generation circuit 220 which corresponds to a combination of the BIST circuit 110 and the redundancy repair data generation circuit 120. The other components of the redundancy control circuit 200 are similar to those of the redundancy control circuit 100 of the first exemplary embodiment.

The BIST function-equipped redundancy repair data generation circuit 220 includes a BIST unit 210, a redundancy repair data setting unit 122, and a redundancy repair data holding unit 123. The BIST unit 210 has a function similar to that of the BIST circuit 110 of the first exemplary embodiment. This enables the BIST function-equipped redundancy repair data generation circuit 220 to perform a redundancy repair operation during execution of BIST. Further, the provision of the BIST unit 210 having the function similar to that of the BIST circuit 110 eliminates the need for the BIST function-equipped redundancy repair data generation circuit 220 to be provided with the defect information storage unit 121 for storing the defect information received from the BIST circuit 110 according to the first exemplary embodiment.

The operation of the redundancy control circuit 200 will be described below. Note that, also in this exemplary embodiment, it is assumed that a number of defects occur in the same manner as in the first exemplary embodiment. It is also assumed that a number of redundant rows (a first redundant row, a second redundant row, . . . ), which can be used for redundancy repair, are prepared in the memory circuit (not shown) of the semiconductor integrated circuit incorporating the redundancy control circuit 200.

Under the first condition, a test and redundancy repair for the memory circuit are carried out. First, the test for the memory circuit is performed by the BIST unit 210. When a defect is first detected at the row address ROW 1 in this test, the redundancy repair data setting unit 122 immediately performs processing. Then, the row address ROW1, at which the defect has been detected, is held in the redundancy repair data holding unit 123 as the redundancy repair data RQ1*a*. Note that the row address ROW1 set in the redundancy repair data RQ1*a* is repaired by fuse cutting to be carried out later by using the first redundant row.

Further, when a defect is detected during a test conducted thereafter and when the defective row address matches the row address ROW1 stored in the redundancy repair data storage location RQ1, the redundancy repair data setting unit 122 does not generate new redundancy repair data. That is, only the redundancy repair data RQ1*a* is held in the redundancy repair data holding unit 123.

Meanwhile, when a defect is detected and the defective row address is the row address ROW2 that does not match the row address ROW1, the redundancy repair data setting unit 122 sets new redundancy repair data RQ2*a*. Then, the redundancy repair data RQ2*a* is held in the redundancy repair data holding unit 123. The row address ROW2 is stored in the redundancy repair data storage location RQ2. The row address ROW2 stored in the redundancy repair data storage location RQ2 is repaired by fuse cutting to be carried out later by using the second redundant row. Each of the fuse use flags of the redundancy repair data RQ1*a* and RQ2*a* indicates "0".

The fuse data conversion circuit 130 converts the defective row address ROW1 of the redundancy repair data RQ1*a* held in the redundancy repair data holding unit 123, into the bit position of a fuse to be cut for defect repair, and the value of the bit position. The fuse cut circuit 140 cuts a fuse located at a position corresponding to the value obtained through the conversion by the fuse data conversion circuit 130. This permits the use of the first redundant row, and the redundancy repair to be carried out under the first condition. The fuse cutting is carried out in this manner, so that the defect repair information obtained under the first condition is stored in the fuse unit 150.

Note that when the redundancy repair data RQ1*a* and RQ2*a* are held in the redundancy repair data holding unit 123, fuses corresponding to the data are cut by the processing of the fuse data conversion circuit 130 and the fuse cut circuit 140. This permits the use of the first redundant row and the second redundant row, and the redundancy repair to be carried out under the first condition.

Then, under the second condition, a test and redundancy repair for the memory circuit are carried out. First, the fuse data readout circuit 160 reads out the bit position information of the fuses cut for the redundancy repair under the first condition. The redundancy repair operation data conversion circuit 170 converts the information about the value of the fuse bit position read out by the fuse data readout circuit 160, into the redundancy repair data RQ1*b*, and sends the redundancy repair data RQ1*b* to the BIST function-equipped redundancy repair data generation circuit 220. Then, the redundancy repair data RQ1*b* is held in the redundancy repair data holding unit 123. The defective row address ROW1, which is identical with that of the redundancy repair data RQ1*a* stored under the first condition, is set in the redundancy repair data held in the redundancy repair data holding unit 123.

If the redundancy repair is carried out under the first condition by using the first redundant row and the second redundant row, defective row addresses identical with the defective row addresses ROW1 and ROW2, which are set in the redundancy repair data RQ1*a* and RQ2*a*, are also set in the redundancy repair data RQ1*b* and RQ2*b*. Each of the fuse use flags of the redundancy repair data RQ1 and RQ2 indicates "1".

Further, a test for the memory circuit is performed by the BIST unit 210 under the second condition. When the defective row address detected as a result of the test matches the defective row address of the redundancy repair data RQ1*b* (or RQ1*b*, RQ2*b*) held in the redundancy repair data holding unit 123, the redundancy repair data setting unit 122 determines that the redundancy repair is not newly performed. Thus, in this case, fuse cutting is not newly performed thereafter.

On the other hand, when a defective row address detected as a result of the test does not match the defective row address of the redundancy repair data RQ1*b* (or RQ1*b*, RQ2*b*) held in the redundancy repair data holding unit 123, the redundancy repair data setting unit 122 sets the defective row address as new redundancy repair data RQ3*a*. The redundancy repair data RQ3*a* is held in the redundancy repair data holding unit 123. The fuse use flag of the redundancy repair data RQ3*a* indicates "0". Accordingly, an operation similar to that described above is carried out, and fuse cutting is newly performed by the processing of the fuse data conversion circuit 130 and the fuse cut circuit 140. As a result, the defect repair information obtained under the second condition is stored in the fuse unit 150.

Furthermore, a test and redundancy repair for the memory circuit may be carried out under the third condition, and processing similar to that described above may be repeated. In this manner, the redundancy repair for repairing occurring defects is carried out under multiple conditions.

Figure 5:
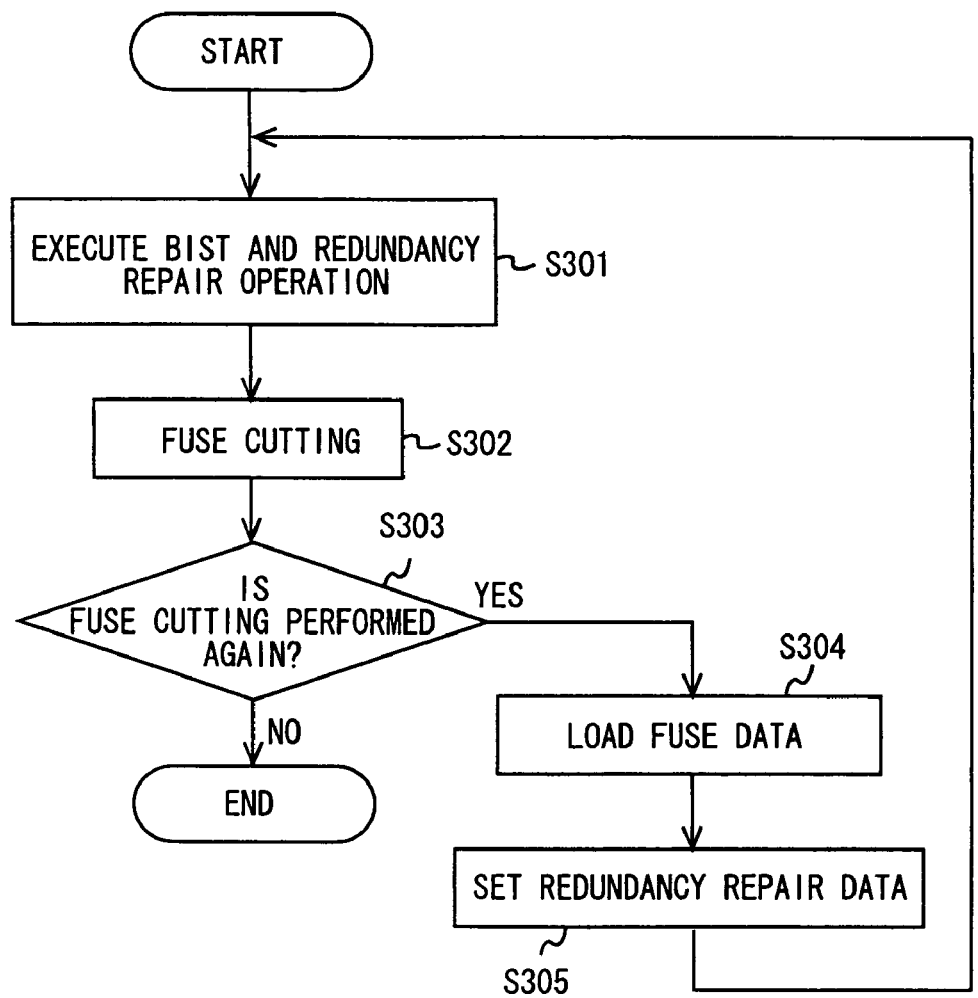
FIG. 5 is a flowchart showing operation of the redundancy control circuit according to the second exemplary embodiment.

FIG. 5 shows a flowchart of the operation of the redundancy control circuit 200 according to the second exemplary embodiment. Referring to FIG. 5, the BIST function-equipped redundancy repair data generation circuit 220 first executes BIST and a redundancy repair operation simultaneously (S301). Based on the operation result, fuse cutting is carried out (S302). In this case, when the fuse cutting is performed again (YES in S303), the data on the fuse, which has previously been cut, is loaded (S304). Based on the previous fuse data, the redundancy repair data is set (S305). After that, based on the redundancy repair data set in S305, the BIST and the redundancy repair operation are executed simultaneously (S301). Then, the processing of S302 is carried out and repeated until there is no need to perform fuse cutting again (NO in S303). As can be seen from the flowchart, the flowchart of the second exemplary embodiment substantially differs from that of the first exemplary embodiment in that the processings of S101 and S102 shown in the flowchart of the first exemplary embodiment described with reference to FIG. 2 are executed simultaneously.

As described above, in the redundancy control circuit 200 of the second exemplary embodiment, a test circuit for performing the BIST and an operational circuit for performing the redundancy repair operation are formed in the same circuit. This eliminates the need for the defect information storage unit 121, which is required for the first exemplary embodiment, and leads to a reduction in circuit size. Moreover, there is an advantage in that the defect information detected by BIST can be immediately processed by the redundancy repair data setting unit 122.

Third Exemplary Embodiment

Figure 6:
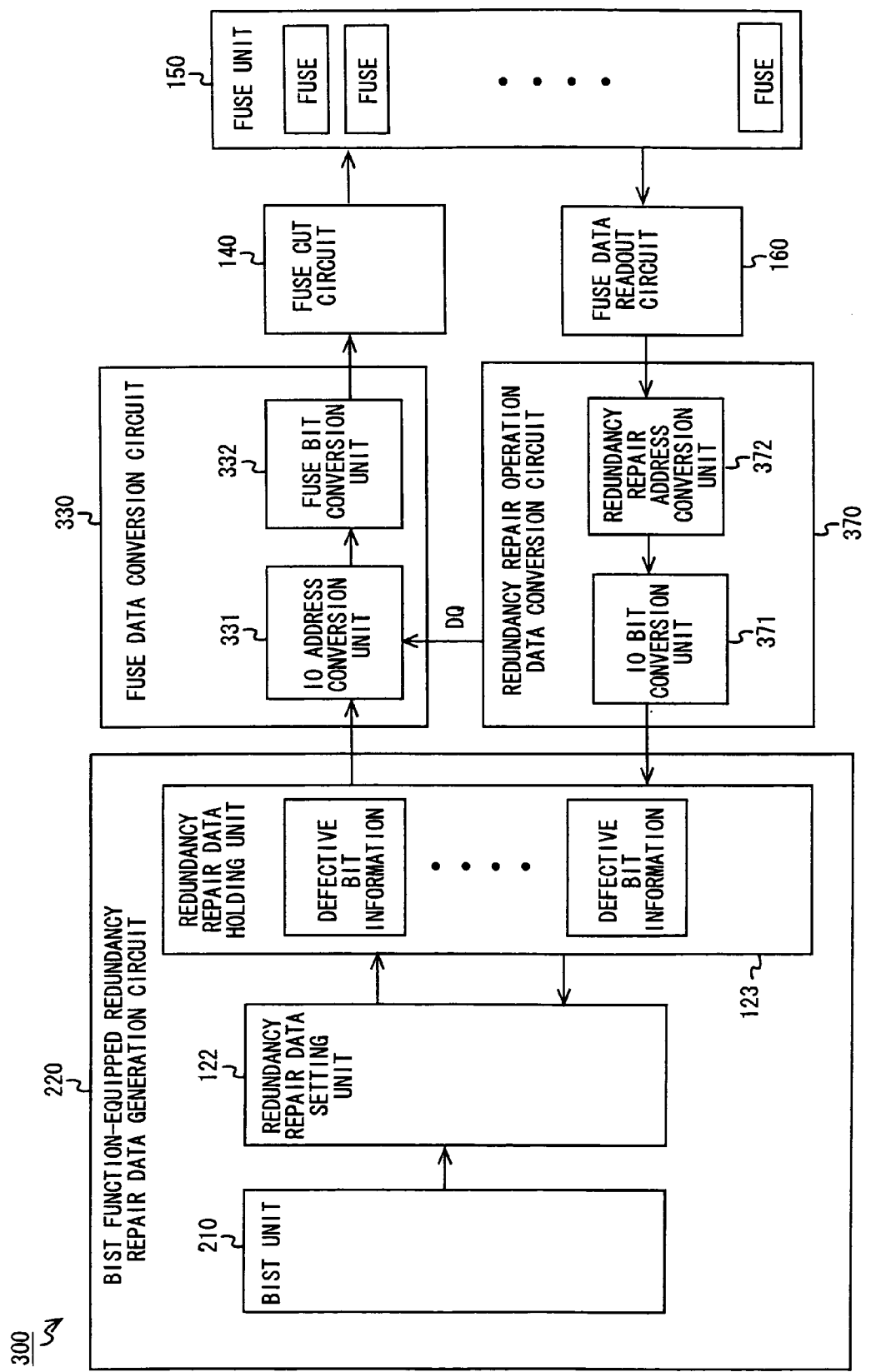
FIG. 6 is a block diagram showing a redundancy control circuit according to a third exemplary embodiment of the present invention.

A third exemplary embodiment of the present invention will be described in detail below with reference to the drawings. It is assumed that a redundancy control circuit 300 described in the third exemplary embodiment controls the redundancy of a memory circuit included in a semiconductor integrated circuit incorporating the redundancy control circuit 300, as with the first exemplary embodiment. FIG. 6 shows the redundancy control circuit 300 according to the third exemplary embodiment.

Referring to FIG. 6, the redundancy control circuit 300 includes the BIST function-equipped redundancy repair data generation circuit 220, a fuse data conversion circuit 330, the fuse cut circuit 140, the fuse unit 150, the fuse data readout circuit 160, and a redundancy repair operation data conversion circuit 370. The components of FIG. 6 denoted by reference numerals identical to those of FIGS. 1 and 4 have configurations identical or similar to those of FIGS. 1 and 4. In the third exemplary embodiment, the differences from the first and second exemplary embodiments are mainly explained, and description of the other configurations is omitted.

Unlike the first and second exemplary embodiments, the redundancy control circuit 300 of the third exemplary embodiment includes the fuse data conversion circuit 330 and the redundancy repair operation data conversion circuit 370. The other components of the redundancy control circuit 300 are similar to those of the redundancy control circuits 100 and 200 of the first and second exemplary embodiments. However, unlike the first and second exemplary embodiments, information of a defective IO bit position is held as the redundancy repair data which is held in the redundancy repair data holding unit 123 of the BIST function-equipped redundancy repair data generation circuit 220. The information of the defective IO bit position herein described is defined as follows.

For example, it is assumed that the memory circuit has a configuration capable of storing 8-bit IO data (hereinafter, referred to as "IO bit"). When a defect is detected in a fifth IO bit, 8-bit data of "00010000" is generated as information of the defective IO bit position. The fifth bit counted from the LSB (right-most bit) indicates the value "1" as position data of a defective bit. If no defect is detected in the memory circuit, 8-bit data of "00000000", in which all the bit values are "0", is generated as information of the defective IO bit position. This is illustrated by way of example, and any value may be used as long as it can specify the position of a defective IO bit. Accordingly, it is assumed that the information of the defective IO bit position is not limited to the above configuration.

The fuse data conversion circuit 330 includes an IO address conversion unit 331 and a fuse bit conversion unit 332. The IO address conversion unit 331 converts the information of the defective IO bit position, which is the redundancy repair data of the redundancy repair data holding unit 123, into an address value. The fuse bit conversion unit 332 converts the information of the address value received from the IO address conversion unit 331, into the bit position of a fuse to be cut for redundancy repair and the value of the bit position, and sends the converted data to the fuse cut circuit 140. The fuse cut circuit 140 cuts the fuse corresponding to the information about the value of the bit position of the fuse.

The redundancy repair operation data conversion circuit 370 includes an IO bit conversion unit 371 and a redundancy repair address conversion unit 372. The redundancy repair address conversion unit 372 converts fuse data received from the fuse data readout circuit 160 into address information corresponding to the position of the defective IO bit. The IO bit conversion unit 371 converts the address information into information of the defective IO bit position, and sends the information to the redundancy repair data holding unit 123.

The operation of the redundancy control circuit 300 will be described below. In this exemplary embodiment, a description is given of the case where the redundancy repair for repairing defects in the memory circuit (not shown) is performed in units of bits. To simplify the explanation, it is assumed that the memory circuit has a configuration capable of storing 8-bit IO data. It is also assumed that a number of redundant IO bits (a first redundant IO bit, a second redundant IO bit, . . . ), which can be used for the redundancy repair, are prepared in the memory circuit.

Under the first condition, a test and redundancy repair for the memory circuit are carried out. First, the test for the memory circuit is performed by the BIST unit 210. When a defect is detected in the fifth IO bit in this test, the redundancy repair data setting unit 122 immediately performs processing. In this case, IO data having the value "1" is generated as the data indicating the defective bit. Specifically, 8-bit data such as "00010000", in which the value of the fifth bit counted from the LSB (right-most bit) is represented as "1", is generated. Then, the data indicating the defective bit, at which the defect has been detected, is held in the redundancy repair data holding unit 123 as the redundancy repair data. Alternatively, the data of the defective IO bit detected by the BIST may be temporarily held in a pipeline register and stored in the redundancy repair data holding unit 123 during the holding time. In the following description, "RB1$a$" and "RB1$b$" each denote redundancy repair data set according to the result of the test conducted under the first condition. "RB2$a$" and "RB2$b$" each denote redundancy repair data which includes the redundancy repair data set according to the result of the test conducted under the first condition and which is set according to the result of the test conducted under the second condition. Herein, "RB1$a$" and "RB2$a$" each represent data directly generated by the redundancy repair data setting unit 122, and "RB1$b$" and "RB2$b$" each represent data obtained by converting data read out from a fuse into redundancy repair data.

The fuse data conversion circuit 330 converts the defective IO bit information of the redundancy repair data RB1$a$ held in the redundancy repair data holding unit 123 into the bit position of a fuse to be cut for defect repair, and the value of the bit position. The fuse cut circuit 140 cuts a fuse located at a position corresponding to the value obtained through the conversion by the fuse data conversion circuit 330. This permits the use of the first redundant IO bit, and the redundancy repair to be carried out under the first condition. The fuse cutting is carried out in this manner, so that the defect repair information obtained under the first condition is stored in the fuse unit 150.

Then, a test and redundancy repair for the memory circuit are carried out under the second condition. First, the fuse data readout circuit 160 reads out the bit position information about the fuse cut for the redundancy repair under the first condition. The redundancy repair operation data conversion circuit 370 converts the information about the value of the fuse bit position read out by the fuse data readout circuit 160 into the redundancy repair data RB1$b$, and sends the redundancy repair data RB1$b$ to the BIST function-equipped redundancy repair data generation circuit 220. Then, the redundancy repair data RB1$b$ is held in the redundancy repair data holding unit 123. The information of the defective IO bit position, which is identical with that of the redundancy repair data RB1$a$ stored under the first condition, is set in the redundancy repair data held in the redundancy repair data holding unit 123. Specifically, 8-bit data of "00010000", which is identical with the information of the defective IO bit position described above, is set.

Further, a test for the memory circuit is performed by the BIST unit 210 under the second condition. When the information of the defective IO bit position detected as a result of the test matches the information of the defective IO bit position of the redundancy repair data RB1$b$ held in the redundancy repair data holding unit 123, the redundancy repair data setting unit 122 determines that the redundancy repair is not newly performed. Thus, in this case, the fuse cutting is not newly performed thereafter.

On the other hand, when the information of the defective IO bit position detected as a result of the test does not match the information of the defective IO bit position of the redundancy repair data RB1$b$ held in the redundancy repair data holding unit 123, the redundancy repair data setting unit 122 performs OR operation between the information of the defective IO bit position and the information of the defective IO bit position of the redundancy repair data RB1$b$, and generates new redundancy repair data RB2$a$.

Specifically, when defects are detected in third and fifth IO bits in the test conducted under the second condition, "00010100" is generated as information of the defective IO bit position. The redundancy repair data setting unit 122 performs OR operation between the information "00010100" indicating the defective IO bit position and the information "00010000" indicating the defective IO bit position of the redundancy repair data RB1$b$, and generates information "00010100" indicating the defective IO bit position, as new redundancy repair data RB2$a$.

Based on the information "00010100" indicating the defective IO bit position of the redundancy repair data RB2$a$, fuse cutting is newly performed by the processing of the fuse data conversion circuit 330 and the fuse cut circuit 140. This permits the use of the second redundant IO bit, and the redundancy repair to be carried out under the second condition. Thus, the defect repair information obtained under the second condition is stored in the fuse unit 150.

Note that when the redundancy repair data holding unit holds only information of the defective IO bit position and does not hold information indicating which fuse has been cut for the repaired IO bit, fuse cutting may be performed in the following manner. That is, information is read out from a circuit which holds fuse cut information (hereinafter, referred to as "fuse cut information holding circuit") and is converted into address information of an IO bit for an uncut fuse. The fuse cut information holding circuit is required to hold an address indicating an IO bit before conversion in the redundancy repair operation data conversion circuit 370, for example. The held data is represented by "DQ" in FIG. 6. Alternatively, as with the first and second exemplary embodiments, the fuse use flag may be set in the redundancy repair data.

Furthermore, a test and redundancy repair for the memory circuit may be carried out under the third condition, and processing similar to that described above may be repeated. In this manner, the redundancy repair for repairing occurring defects is carried out under multiple conditions.

In general, the test for the memory circuit is conducted at one address per cycle. Regarding the IO, however, all of the bits (eight bits in the above exemplary embodiment) are tested simultaneously. For this reason, a large number of clock cycles are required to determine, based on the test result of BIST, which bit is defective and whether the defect in the bit matches the defect previously detected. In addition, the number of defective bits to be detected per BIST is not limited to one. Regarding the IO (IO data), however, all of the bits (eight bits in the above exemplary example) are tested simultaneously.

In the third exemplary embodiment, in the case of performing a redundancy repair operation for the IO (IO data) by utilizing the above technique, defective portions are detected by the number of bits, and each defective portion is represented by a bit position (e.g., as represented by the value "1" of "00010100" in the above exemplary embodiment) of data corresponding to the number of IO bits. Then, after the BIST is finished, the bit position is converted into an addresses corresponding to the bit position. This provides an advantage of improving the efficiency of the test and redundancy repair.

Note that the present invention is not limited to the exemplary embodiments described above, and can be modified in various ways without departing from the scope of the present invention.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

The first to third exemplary embodiments can be combined as desirable by one of ordinary skill in the art.

What is claimed is:

1. An integrated circuit comprising:
   a plurality of memory cells;
   a plurality of fuses;
   a redundant memory having a function of repairing a defective cell included in the plurality of memory cells by placing a corresponding fuse among the plurality of fuses into a first state;
   a fuse data conversion circuit that generates first information of a first defective cell based on position information of the fuse placed into the first state, the fuse corresponding to the first defective cell having been repaired;
   a repair data generation circuit that generates, upon detection of a second defective cell as a result of a test for the plurality of memory cells, repair information for repairing the second defective cell according to the first information of the first defective cell and second information of the second defective cell detected; and
   a fuse state change circuit that places a predetermined fuse among the plurality of fuses into the first state according to the repair information generated by the repair data generation circuit.

2. The integrated circuit according to claim 1, wherein the repair data generation circuit comprises:
   a holding unit that holds the first information of the first defective cell received from the fuse data conversion circuit; and
   a repair data setting unit that sets repair information corresponding to the second information of the second defective cell, when a data value of the second information of the second defective cell detected as a result of the test for the plurality of memory cells is different from a data value of the first information of the first defective cell held in the holding unit.

3. The integrated circuit according to claim 2, wherein the repair data generation circuit further comprises a test unit that performs a test on the plurality of memory cells.

4. The integrated circuit according to claim 1, further comprising a test circuit that performs a test on the plurality of memory cells,
   wherein the repair data generation circuit comprises:
      a storage unit that stores the second information of the second defective cell detected as a result of the test performed by the test circuit;
      a holding unit that holds the first information of the first defective cell received from the fuse data conversion circuit; and
      a repair data setting unit that sets repair information corresponding to the second information of the second defective cell, when a data value of the second information of the second defective cell stored in the storage unit is different from a data value of the first information of the first defective cell held in the holding unit.

5. The integrated circuit according to claim 1, wherein the first state is a state in which a fuse is cut.

6. The integrated circuit according to claim 5, wherein the fuse data conversion circuit comprises:
   a fuse data readout circuit that reads out position information of a cut fuse corresponding to the first defective cell; and
   a repair data conversion circuit that converts the position information of the cut fuse into the first information of the first defective cell, the position information being read out by the fuse data readout circuit.

7. The integrated circuit according to claim 5, wherein the fuse state change circuit comprises:
   a fuse data conversion circuit that generates position information of a fuse to be cut, according to the repair information from the repair data generation circuit; and
   a fuse cut circuit that cuts a fuse corresponding to the position information of the fuse received from the fuse data conversion circuit.

\* \* \* \* \*